(12) United States Patent
Lee et al.

(10) Patent No.: US 10,916,616 B2
(45) Date of Patent: Feb. 9, 2021

(54) DISPLAY DEVICE HAVING FLEXIBLE NON-DISPLAY AREA PORTION

(71) Applicant: SAMSUNG DISPLAY CO., LTD., Yongin-si (KR)

(72) Inventors: Donghyun Lee, Yongin-si (KR); Deukjong Kim, Yongin-si (KR); Keunsoo Lee, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 16/262,262

(22) Filed: Jan. 30, 2019

(65) Prior Publication Data

US 2019/0165081 A1 May 30, 2019

Related U.S. Application Data

(63) Continuation of application No. 15/684,236, filed on Aug. 23, 2017, now Pat. No. 10,211,277.

(30) Foreign Application Priority Data

Nov. 18, 2016 (KR) .......................... 10-2016-0154453

(51) Int. Cl.
  *H01L 27/32* (2006.01)
  *H01L 51/00* (2006.01)
  *H01L 27/12* (2006.01)

(52) U.S. Cl.
  CPC ...... *H01L 27/3276* (2013.01); *H01L 27/3262* (2013.01); *H01L 51/0097* (2013.01);
  (Continued)

(58) Field of Classification Search
  None
  See application file for complete search history.

(56) References Cited

U.S. PATENT DOCUMENTS 8,791,455 B2 7/2014 Kim et al.
10,211,277 B2 * 2/2019 Lee ..................... H01L 27/3262
(Continued)

FOREIGN PATENT DOCUMENTS

EP 3051333 A1 8/2016
KR 1020140045193 A 4/2014
(Continued)

*Primary Examiner* — Bilkis Jahan
(74) *Attorney, Agent, or Firm* — Cantor Colburn LLP

(57) ABSTRACT

A display device includes a substrate including a display area and a peripheral area and being flexible around a bending axis in the peripheral area, a data line and a driving voltage line in the display area, an inorganic insulating layer defines an opening corresponding to the flexible area, a first and second conductive layers in the peripheral area and being spaced apart from each other around the opening, an organic insulating layer covering the first and second conductive layers, and a connection conductive layer connecting the first and second conductive layers via contact holes of the organic insulating layer, and the first and second conductive layers includes a same material as that of one of the data line and the driving voltage line, and the connection conductive layer includes a same material as that of the other of the data line and the driving voltage line.

14 Claims, 13 Drawing Sheets

(52) U.S. Cl.
CPC ........ *H01L 27/124* (2013.01); *H01L 27/3258* (2013.01); *H01L 2251/5338* (2013.01); *Y02E 10/549* (2013.01)

(56) References Cited

U.S. PATENT DOCUMENTS

| | | | |
|---|---|---|---|
| 2014/0042406 A1 | 2/2014 | Degner et al. | |
| 2014/0217397 A1 | 8/2014 | Kwak et al. | |
| 2015/0115234 A1* | 4/2015 | Hong | H01L 51/5253 257/40 |
| 2016/0043349 A1* | 2/2016 | Park | H01L 27/3244 257/40 |
| 2016/0233289 A1* | 8/2016 | Son | H01L 27/3258 |
| 2016/0293889 A1* | 10/2016 | Nakamura | H01L 51/5253 |

FOREIGN PATENT DOCUMENTS

| | | |
|---|---|---|
| KR | 1020140099139 A | 8/2014 |
| KR | 1020140129647 A | 11/2014 |
| WO | 2016032175 A1 | 3/2016 |

\* cited by examiner

DISPLAY DEVICE HAVING FLEXIBLE NON-DISPLAY AREA PORTION

This application is a continuation of U.S. patent application Ser. No. 15/684,236, filed on Aug. 23, 2017, which claims priority to Korean Patent Application No. 10-2016-0154453, filed on Nov. 18, 2016, and all the benefits accruing therefrom under 35 U.S.C. § 119, the content of which in its entirety is herein incorporated by reference.

BACKGROUND

1. Field

Exemplary embodiments relate to a display device.

2. Description of the Related Art

Purposes of a display device have been diversified. Also, since the display device has a thin thickness and is lightweight, the range of usage of the display device has been gradually widened. As the display device is utilized variously, design purposes of the display device such as reduction in the area of a non-display area have been diversified.

SUMMARY

Exemplary embodiments are directed to a display device having a structure in which at least a portion of a non-display area is flexible. However, these exemplary embodiments are provided as examples and the scope of the disclosure is not limited thereto.

Additional features will be set forth in part in the description which follows and, in part, will be apparent from the description, or may be learned by practice of the presented embodiments.

According to an exemplary embodiment, a display device includes a substrate including a display area and a peripheral area, outside the display area, which includes a flexible area in which the substrate is flexible around a bending axis located and extending in one direction, a data line and a driving voltage line disposed in the display area, an inorganic insulating layer on the substrate and which defines an opening corresponding to the flexible area, a first conductive layer and a second conductive layer disposed in the peripheral area and which are spaced apart from each other around the opening, an organic insulating layer which covers the first conductive layer and the second conductive layer, and a connection conductive layer on the organic insulating layer. The connection conductive layer connects the first conductive layer and the second conductive layer via contact holes defined in the organic insulating layer, the first conductive layer and the second conductive layer includes a same material as that of one of the data line and the driving voltage line, and the connection conductive layer includes a same material as that of the other of the data line and the driving voltage line.

In an exemplary embodiment, the first conductive layer and the second conductive layer may be disposed on the inorganic insulating layer.

In an exemplary embodiment, a portion of the organic insulating layer may be disposed between the data line and the driving voltage line.

In an exemplary embodiment, the display device may further include a third conductive layer inside the opening and which includes the same material as that of the first conductive layer and the second conductive layer.

In an exemplary embodiment, the connection conductive layer may connect to the third conductive layer via a contact hole defined in the organic insulating layer.

In an exemplary embodiment, the connection conductive layer may include a first connection conductive layer which connects the first conductive layer to the third conductive layer and a second connection conductive layer which connects the second conductive layer to the third conductive layer and is spaced apart from the first connection conductive layer.

In an exemplary embodiment, the third conductive layer may include a plurality of sub-conductive layers spaced apart from each other inside the opening, and the connection conductive layer may further include an additional connection conductive layer which connects adjacent sub-conductive layers among the plurality of sub-conductive layers.

In an exemplary embodiment, the display device may further include an additional driving voltage line which overlaps at least a portion of the driving voltage line and is spaced apart from the driving voltage line and electrically connected to the driving voltage line.

In an exemplary embodiment, the additional driving voltage line may include the same material as that of the data line.

In an exemplary embodiment, the substrate may include a plastic layer, and at least a portion of the organic insulating layer inside the opening directly may contact the plastic layer of the substrate.

In an exemplary embodiment, the substrate may further include an inorganic barrier layer on the plastic layer and which defines an opening corresponding to the opening of the inorganic insulating layer and exposing the plastic layer.

According to an exemplary embodiments, a display device includes a substrate including a display area and a peripheral area, outside the display area, where includes a flexible area, a thin film transistor disposed in the display area and which includes a semiconductor layer and a gate electrode, an inorganic insulating layer on the substrate and which covers the gate electrode and defines an opening corresponding to the flexible area, a pixel electrode disposed in the display area and which is connected to the thin film transistor, a first wiring layer and a second wiring layer disposed in the display area and between the inorganic insulating layer and the pixel electrode, a first conductive layer and a second conductive layer disposed in the peripheral area, spaced apart from each other around the opening, and on the inorganic insulating layer, an organic insulating layer which covers the first conductive layer and the second conductive layer and a connection conductive layer on the organic insulating layer and which connects the first conductive layer and the second conductive layer via contact holes respectively defined in the organic insulating layer. The first conductive layer and the second conductive layer includes the same material as that of one of the first wiring layer and the second wiring layer, and the connection conductive layer includes the same material as that of the other of the first wiring layer and the second wiring layer.

In an exemplary embodiment, a portion of the organic insulating layer may be disposed between the first wiring layer and the second wiring layer.

In an exemplary embodiment, the first wiring layer and the second wiring layer may be connected to each other via a contact hole defined in the organic insulating layer.

In an exemplary embodiment, the first wiring layer and the second wiring layer may respectively be an upper driving voltage line and a lower driving voltage line.

In an exemplary embodiment, the display device may further include a data line and a driving voltage line in the display area and which are electrically connected to the thin film transistor, one of the first wiring layer and the second wiring layer may be the data line, and the other of the first wiring layer and the second wiring layer may be the driving voltage line.

In an exemplary embodiment, the display device may further include a third conductive layer inside the opening and which includes the same material as that of the first conductive layer and the second conductive layer.

In an exemplary embodiment, the connection conductive layer may connect the third conductive layer via a contact hole defined in the organic insulating layer.

In an exemplary embodiment, the connection conductive layer may include a plurality of sub-connection conductive layers, and each of the plurality of sub-connection conductive layers may connect two adjacent conductive layers among the first to third conductive layers.

In an exemplary embodiment, the substrate may include a plastic layer, and at least a portion of the organic insulating layer inside the opening may directly contact the plastic layer via the opening.

Exemplary embodiments provide a display device which may implement "bezel-less" by reducing an area of a non-display area and which may minimize the occurrence of defect such as disconnection. However, the scope of the disclosure is not limited by this effect.

BRIEF DESCRIPTION OF THE DRAWINGS

These and/or other features will become apparent and more readily appreciated from the following description of the exemplary embodiments, taken in conjunction with the accompanying drawings in which.

DETAILED DESCRIPTION

Figure 1:
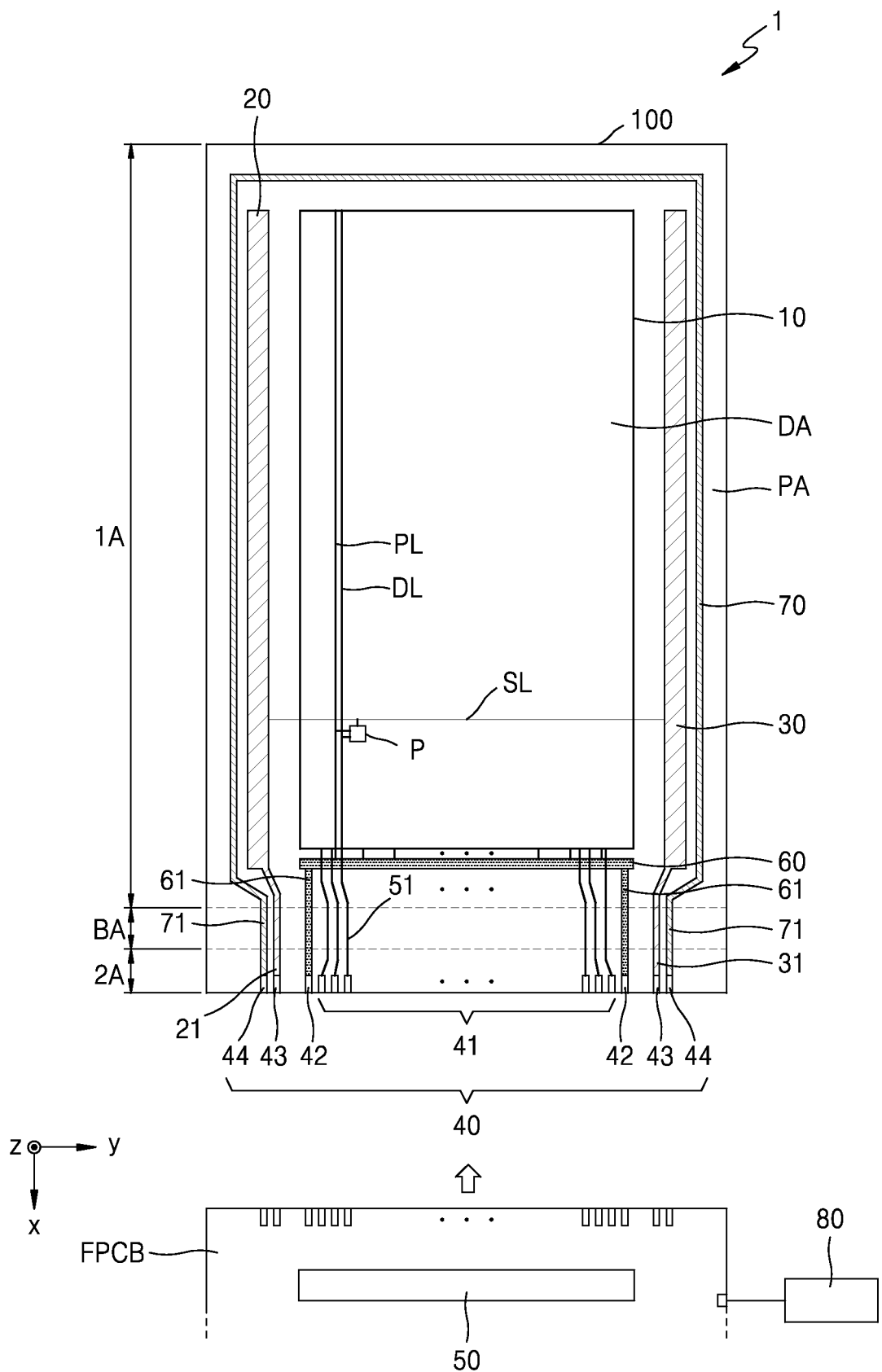
FIG. 1 is a plan view of an exemplary embodiment of a display device.

As the disclosure allows for various changes and numerous embodiments, exemplary embodiments will be illustrated in the drawings and described in detail in the written description. An effect and a characteristic of the disclosure, and a method of accomplishing these will be apparent when referring to embodiments described with reference to the drawings. This disclosure may, however, be embodied in many different forms and should not be construed as limited to the exemplary embodiments set forth herein.

As used herein, the term "and/or" includes any and all combinations of one or more of the associated listed items.

Expressions such as "at least one of" when preceding a list of elements, modify the entire list of elements and do not modify the individual elements of the list.

Hereinafter, the disclosure will be described more fully with reference to the accompanying drawings, in which exemplary embodiments of the disclosure are shown. When description is made with reference to the drawings, like reference numerals in the drawings denote like or corresponding elements, and repeated description thereof will be omitted.

It will be understood that when an element is referred to as being "on" another element, it can be directly on the other element or intervening elements may be present therebetween. In contrast, when an element is referred to as being "directly on" another element, there are no intervening elements present.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be understood that although the terms "first", "second", etc. may be used herein to describe various components, these components should not be limited by these terms. These components are only used to distinguish one component from another.

As used herein, the singular forms "a" "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following exemplary embodiments are not limited thereto.

When a certain exemplary embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the following exemplary embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
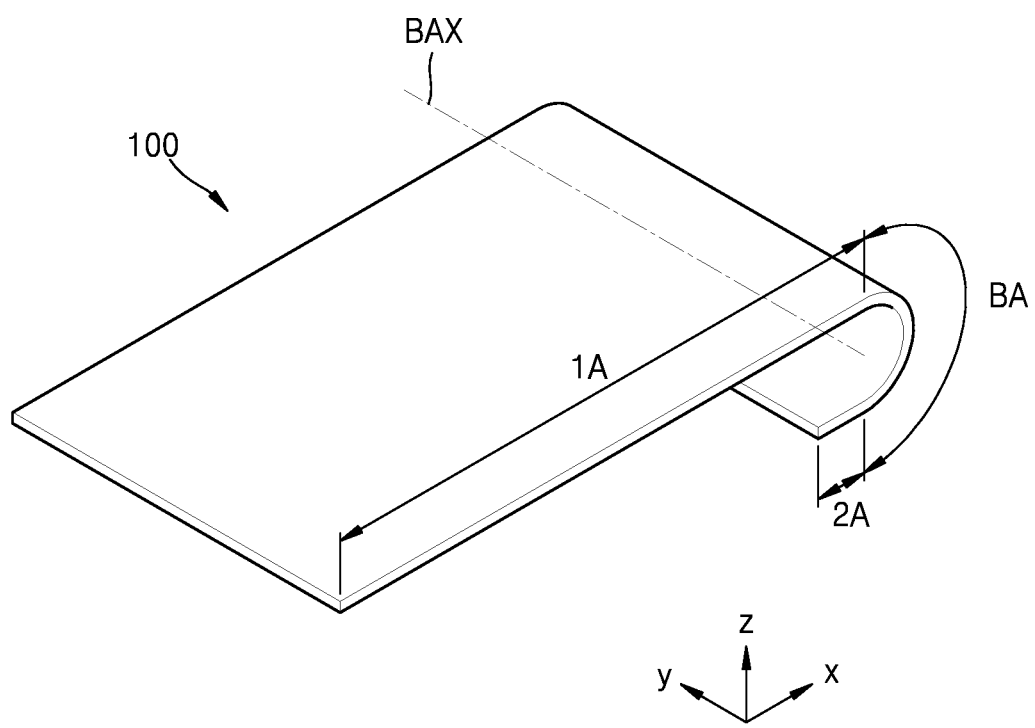
FIG. 2 is a perspective view of an exemplary embodiment of a portion of a display device.

FIG. 1 is a plan view of an exemplary embodiment of a display device 1, and FIG. 2 is a perspective view of an exemplary embodiment of a portion of the display device 1.

Referring to FIG. 1, the display device 1 includes a display unit 10 on a substrate 100. The display unit 10 includes pixels P. Each of the pixels P is connected to a scan line SL extending in a y-direction and a data line DL extending in an x-direction and crossing the y-direction.

In an exemplary embodiment, each pixel P may emit, for example, red, green, blue, or white light and include an organic light-emitting diode ("OLED"). The display unit 10 provides a predetermined image via light emitted from the pixels P and defines a display area DA. Here, the pixel P denotes a sub-pixel emitting red, green, blue, or white light as described above.

A peripheral area PA is disposed at outside of the display area DA. In an exemplary embodiment, for example, the peripheral area PA may surround the display area DA. The peripheral area PA is a region in which the pixels P are not arranged and does not provide the predetermined image via light emitted from the pixels P. In an exemplary embodiment, the peripheral area PA may include a first scan driver 20 and a second scan driver 30, a terminal portion 40, a driving voltage supply line 60, and a common voltage supply line 70.

In an exemplary embodiment, the first and second scan drivers 20 and 30 may be disposed in the peripheral area PA of the substrate 100, generate a scan signal, and transfer the scan signal to the pixel P via the scan line SL. In an exemplary embodiment, for example, the first scan driver 20 may be in the left of the display unit 10, and the second scan driver 30 may be in the right of the display unit 10. However, the invention is not limited thereto. In another exemplary embodiment, the display device 1 may include only one scan driver in the left or right.

The terminal portion 40 may be disposed in one side of the substrate 100 and include a plurality of terminals 41, 42, 43, and 44. The terminal portion 40 may not be covered with an insulating layer, be exposed to outside, and be electrically connected to a flexible printed circuit board ("FPCB").

The FPCB connects a controller 80 to the terminal portion 40 electrically. Signals or power transferred from the controller 80 moves to wirings 21, 31, 51, 61, and 71 connected to the terminal portion 40.

The controller 80 receives a vertical synchronization signal, a horizontal synchronization signal, and a clock signal and generates control signals for controlling driving of the first and second scan drivers 20 and 30. The generated control signals may be transferred to the first and second scan drivers 20 and 30 respectively via the terminal 43 and the wirings 21 and 31. Scan signals of the first and second scan drivers 20 and 30 are provided to the pixels P via the scan lines SL. Also, the controller 80 provides a driving voltage ELVDD and a common voltage ELVSS to the driving voltage supply line 60 and the common voltage supply line 70 respectively via the terminals 42 and 44 connected to the FPCB and the wirings 61 and 71. The driving voltage ELVDD is provided to each pixel P via a driving voltage line PL, and the common voltage ELVSS may be provided to an opposite electrode of the pixel P.

A data driver 50 may be in the FPCB. The data driver 50 provides a data signal to each pixel P. The data signal of the data driver 50 is provided to the pixel P via the terminal 41, the wiring 51 connected to the terminal 41, and the data line DL connected to the wiring 51. Although FIG. 1 illustrates that the data driver 50 is in the FPCB, the invention is not limited thereto. In another exemplary embodiment, the data driver 50 may be in the peripheral area PA of the substrate 100.

The driving voltage supply line 60 is in the peripheral area PA. In an exemplary embodiment, for example, the driving voltage supply line 60 may be between the terminal portion 50 and the display unit 10. The driving voltage ELVDD provided from the controller 80 via the wiring 61 connected to the terminal 41 is provided to each pixel P via the driving voltage line PL as described above.

The common voltage supply line 70 is in the peripheral area PA and provides the common voltage ELVSS to an opposite electrode (e.g., a cathode) of an OLED of each pixel P. In an exemplary embodiment, for example, the common voltage supply line 70 has a loop form having one side open and may extend along edges of the substrate 100 except the terminal portion 40.

The peripheral area PA includes a flexible area BA. The flexible area BA may be between the terminal portion 40 and the display unit 10. The flexible area BA may extend in a direction crossing an extending direction of the wirings 21, 31, 51, 61, and 71. In an exemplary embodiment, for example, the flexible area BA may extend in a y-direction with a predetermined width along an x-direction. The flexible area BA divides the substrate 100 into a first area 1A including the display area DA, and a second area 2A which is an opposite side to the first area 1A with respect to the flexible area BA. That is, the flexible area BA is between the first area 1A and the second area 2A. The first area 1A may include the display area DA and a portion of the peripheral area PA. The second area 2A may include only a portion of the peripheral area PA.

The display device 1 may be bent or curved around the flexible area BA. As illustrated in FIG. 2, a portion of the substrate 100 of the display device 1 is bent. In an exemplary embodiment, for example, the substrate 100 is bent around a bending axis BAX extending in the y-direction and thus the display device 1 has a bent shape like the bent substrate 100. The substrate 100 may include various materials (e.g., a polymer resin) having a flexible or bendable characteristic. For convenience of description, FIG. 2 illustrates a structure in which the substrate 100, not the entire display device 1, is bent.

Figure 3:
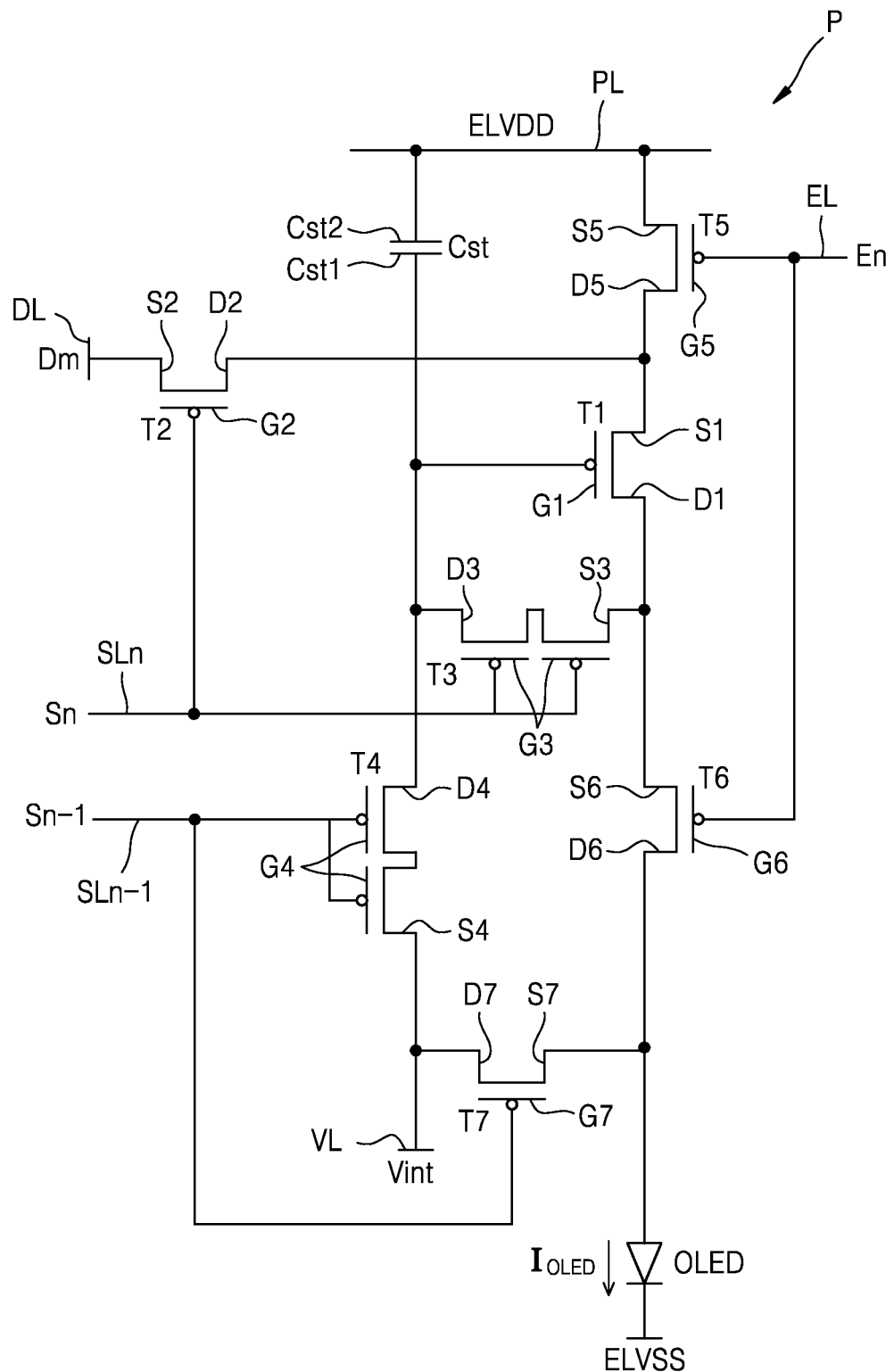
FIG. 3 is a circuit diagram of an exemplary embodiment of one pixel of the display device of FIG. 1.

FIG. 3 is a circuit diagram of an exemplary embodiment of one pixel of the display device 1 of FIG. 1.

Referring to FIG. 3, a pixel P may include signal lines SLn, SLn−1, EL, and DL, a plurality of thin film transistors ("TFTs") T1, T2, T3, T4, T5, T6, and T7 connected to the signal lines, a storage capacitor Cst, an initialization voltage line VL, a driving voltage line PL, and an OLED.

Although FIG. 3 illustrates a case where each pixel P includes the signal lines SLn, SLn−1, EL, and DL, the initialization voltage line VL, and the driving voltage line PL, the invention is not limited thereto. In another exemplary embodiment, at least one of the signals lines SLn, SLn−1, EL, and DL and/or the initialization voltage line VL may be shared by adjacent pixels.

The TFTs may include a driving TFT T1, a switching TFT T2, a compensation TFT T3, a first initialization TFT T4, an operation control TFT T5, an emission control TFT T6, and a second initialization TFT T7.

The signal lines include the scan line SLn which transfers a scan signal Sn, the previous scan line SLn−1 which transfers a previous scan signal Sn−1 to the first initialization TFT T4 and the second initialization TFT T7, the emission control line EL which transfers an emission control signal En to the operation control TFT T5 and the emission control TFT T6, and the data line DL which crosses the scan line SLn and transfers a data signal Dm to the switching TFT T2. The driving voltage line PL transfers the driving voltage ELVDD to the driving TFT T1 via the operation control TFT T5, and the initialization voltage line VL transfers an initialization voltage Vint to the driving TFT T1 for initialization via the first initialization TFT T4 and to a pixel electrode of the OLED for initialization via the second initialization TFT T7.

A driving gate electrode G1 of the driving TFT T1 is connected to a first storage capacitor plate Cst1, a driving source electrode S1 of the driving TFT T1 is electrically connected to the driving voltage line PL via the operation control TFT T5, and a driving drain electrode D1 of the driving TFT T1 is electrically connected to the pixel electrode of the OLED via the emission control TFT T6. The driving TFT T1 receives the data signal Dm and supplies a driving current $I_{OLED}$ to the OLED in response to a switching operation of the switching TFT T2.

A switching gate electrode G2 of the switching TFT T2 is connected to the scan line SLn, a switching source electrode S2 of the switching TFT T2 is connected to the data line DL, and a switching drain electrode D2 of the switching TFT T2 is connected to the driving source electrode S1 of the driving TFT T1 and electrically connected to the driving voltage line PL via the operation control TFT T5. The switching TFT T2 is turned on in response to a scan signal Sn transferred via the scan line SLn and performs the switching operation of transferring the data signal Dm from the data line DL to the driving source electrode S1 of the driving TFT T1.

A compensation gate electrode G3 of the compensation TFT T3 is connected to the scan line SLn, a compensation source electrode S3 of the compensation TFT T3 is connected to the driving drain electrode D1 of the driving TFT T1 and electrically connected to the pixel electrode of the OLED via the emission control TFT T6, and a compensation drain electrode D3 of the compensation TFT T3 is connected to the first storage capacitor plate Cst1 of the storage capacitor Cst, a first initialization drain electrode D4 of the first initialization TFT T4, and the driving gate electrode G1 of the driving TFT T1. The compensation TFT T3 is turned on in response to the scan signal Sn transferred via the scan line SLn, and the turned-on TFT T3 makes the driving TFT T1 function as a diode by electrically connecting the driving gate electrode G1 of the driving TFT T1 to the driving drain electrode D1 of the driving TFT T1.

A first initialization gate electrode G4 of the first initialization TFT T4 is connected to the previous scan line SLn−1, a first initialization source electrode S4 of the first initialization TFT T4 is connected to a second initialization drain electrode D7 of the second initialization TFT T7 and the initialization voltage line VL, and the first initialization drain electrode D4 of the first initialization TFT T4 is connected to the first storage capacitor plate Cst1 of the storage capacitor Cst, the compensation drain electrode D3 of the compensation TFT T3, and the driving gate electrode G1 of the driving TFT T1. The first initialization TFT T4 is turned on in response to the previous scan signal Sn−1 transferred via the previous scan line SLn−1 and initializes a voltage of the driving gate electrode G1 of the driving TFT T1 by transferring the initialization voltage Vint to the driving gate electrode G1 of the driving TFT T1.

An operation control gate electrode G5 of the operation control TFT T5 is connected to the emission control line EL, an operation control source electrode S5 of the operation control TFT T5 is connected to the driving voltage line PL, and an operation control drain electrode D5 of the operation control TFT T5 is connected to the driving source electrode S1 of the driving TFT T1 and connected to the switching drain electrode D2 of the switching TFT T2.

An emission control gate electrode G6 of the emission control TFT T6 is connected to the emission control line EL, an emission control source electrode S6 of the emission control TFT T6 is connected to the driving drain electrode D1 of the driving TFT T1 and connected to the compensation source electrode S3 of the compensation TFT T3, and an emission control drain electrode D6 of the emission control TFT T6 is connected to the second initialization source electrode S7 of the second initialization TFT T7 and connected to the pixel electrode of the OLED.

The operation control TFT T5 and the emission control TFT T6 are simultaneously turned on in response to the emission control signal En transferred via the emission control line EL, transfer the driving voltage ELVDD to the OLED, and allow the driving current $I_{OLED}$ to flow through the OLED.

A second initialization gate electrode G7 of the second initialization TFT T7 is connected to the previous scan line SLn−1, a second initialization source electrode S7 of the second initialization TFT T7 is connected to the emission control drain electrode D6 of the emission control TFT T6 and connected to the pixel electrode of the OLED, and a second initialization drain electrode D7 of the second initialization TFT T7 is connected to the first initialization source electrode S4 of the first initialization TFT T4 and connected to the initialization voltage line VL. The second initialization TFT T7 is turned on in response to a previous scan signal Sn−1 transferred via the previous scan line SLn-1 and initializes the pixel electrode of the OLED using the initialization voltage Vint.

Although FIG. 3 illustrates a case where the first initialization TFT T4 and the second initialization TFT T7 are connected to the previous scan line SLn-1, the invention is not limited thereto. In another exemplary embodiment, the first initialization TFT T4 may be connected to the previous scan line SLn-1 and driven in response to the previous scan signal Sn-1, and the second initialization TFT T7 may be connected to a separate signal line (e.g., a next scan line) and driven in response to a signal transferred via the separate signal line.

A second storage capacitor plate Cst2 of the storage capacitor Cst is connected to the driving voltage line PL, and an opposite electrode of the OLED is connected to the common voltage ELVSS. Therefore, the OLED may display an image by receiving the driving current $I_{OLED}$ from the driving TFT T1 and emitting light.

Although FIG. 3 illustrates that the compensation TFT T3 and the first initialization TFT T4 have dual gate electrodes, the invention is not limited thereto. For example, in another exemplary embodiment, the compensation TFT T3 and the first initialization TFT T4 may have one gate electrode. Also, in still another exemplary embodiment, at least one of the other TFTs T1, T2, T5, T6, and T7 besides the compensation TFT T3 and the first initialization TFT T4 may have dual gate electrodes, and various modifications may be made.

Figure 4:
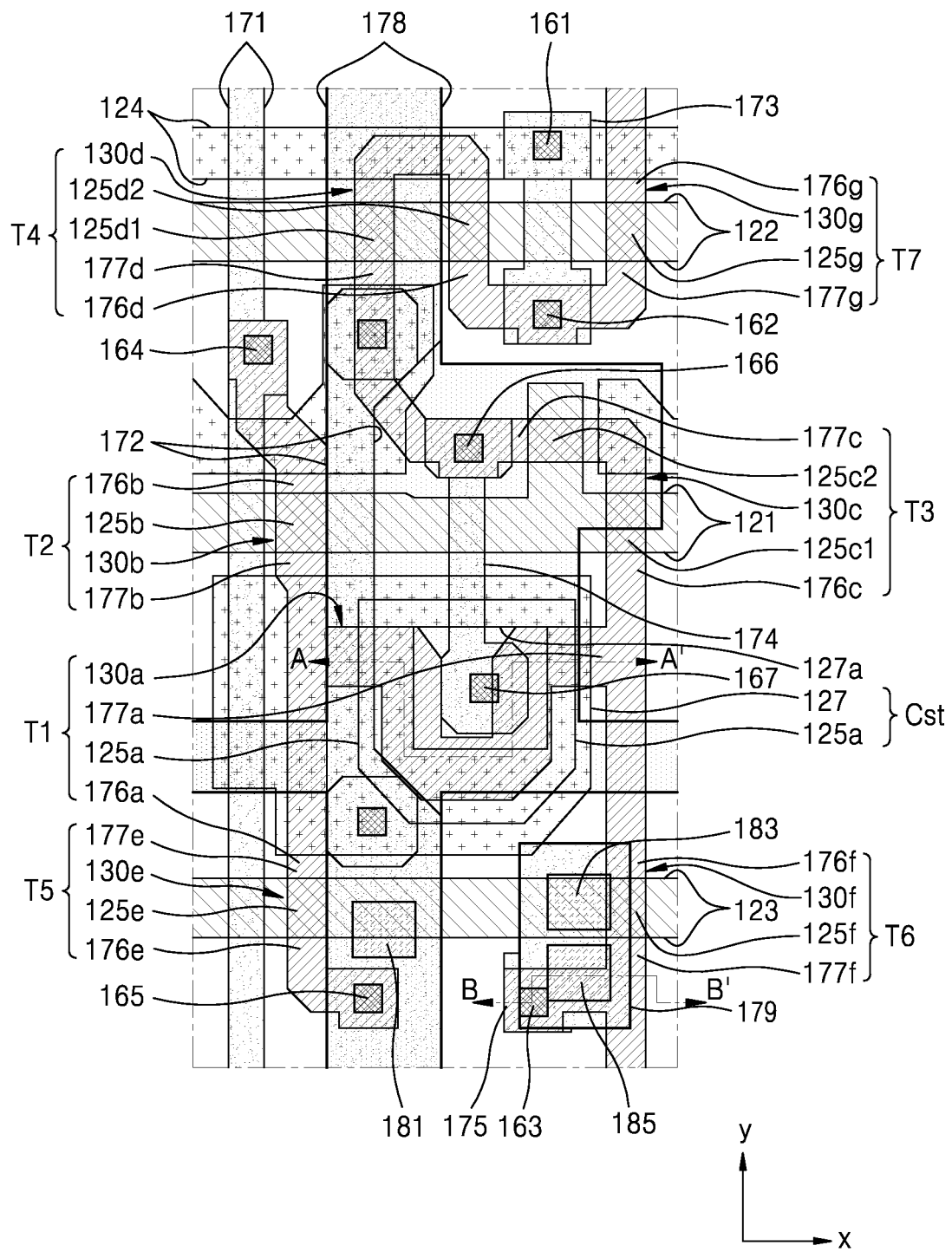
FIG. 4 is a plan view of an exemplary embodiment of one pixel of the display device of FIG. 1.
Figure 5:
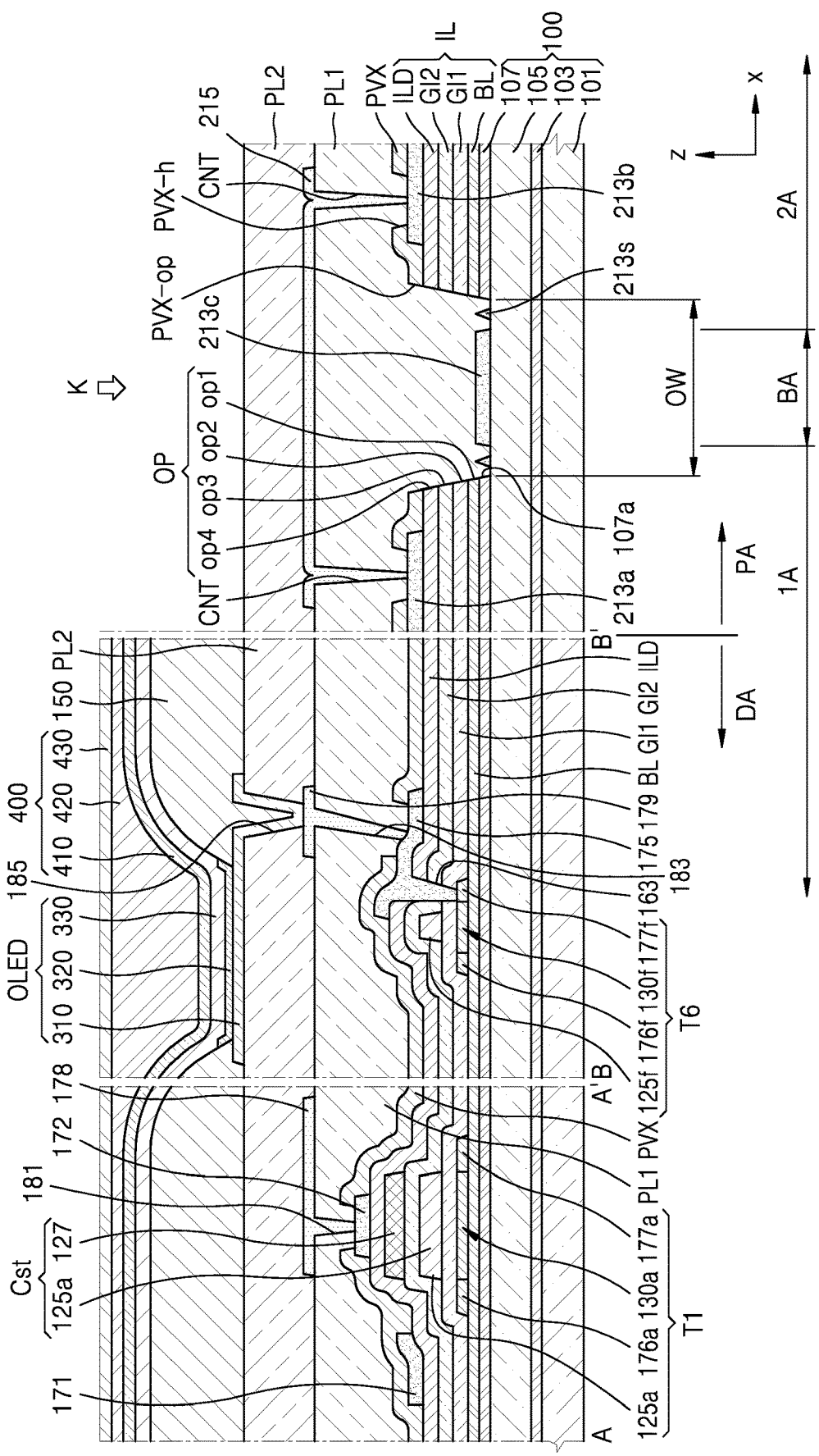
FIG. 5 is a cross-sectional view of an exemplary embodiment of a portion of a display device.
Figure 6:
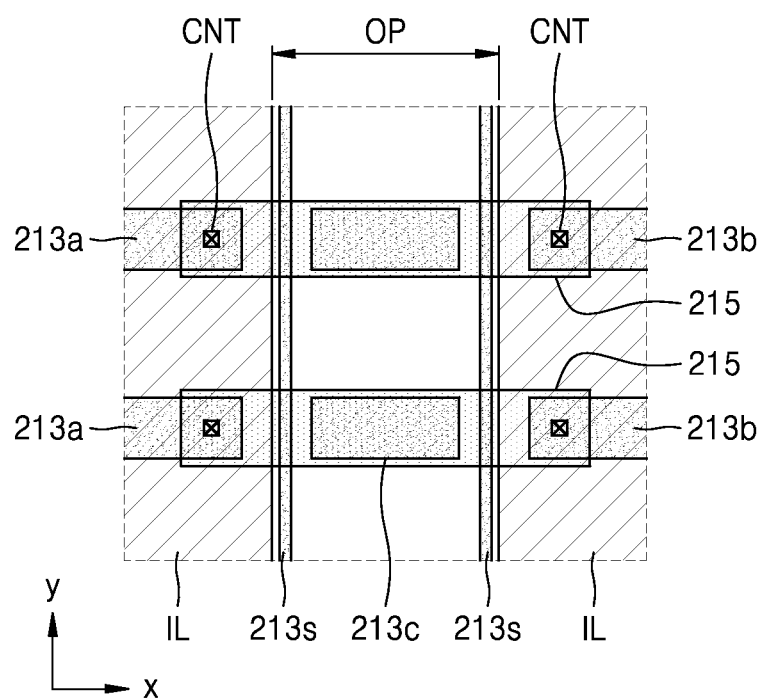
FIG. 6 is a plan view of an exemplary embodiment of a peripheral area including a flexible area of FIG. 5 viewed in a direction K.
Figure 7A:
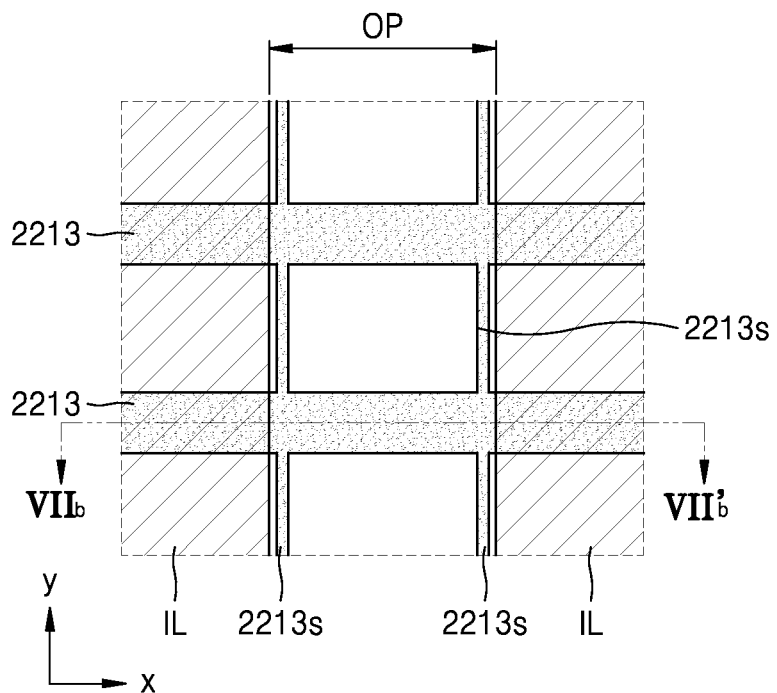
FIGS. 7A and 7B respectively are a plan view and a cross-sectional view of a peripheral area including a flexible area according to a compared example.
Figure 7B:
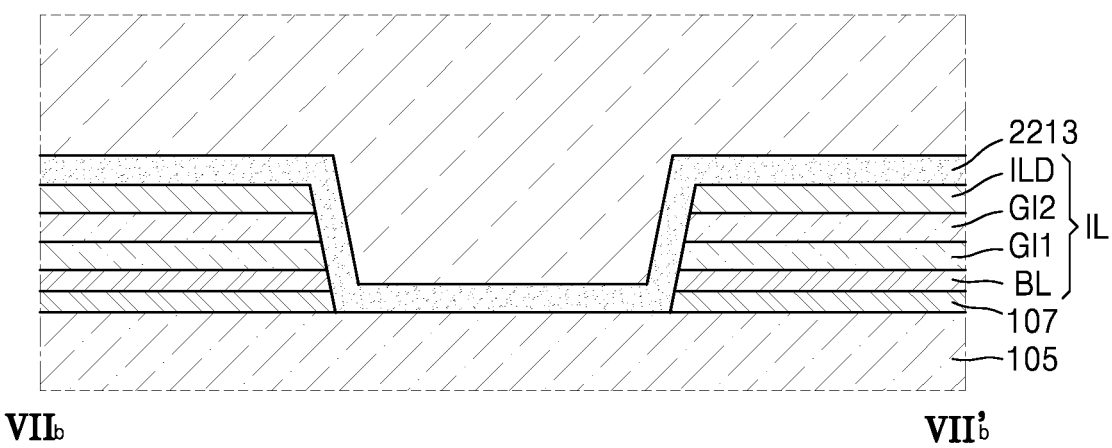

FIG. 4 is a plan view of an exemplary embodiment of one pixel of the display device of FIG. 1, FIG. 5 is a cross-sectional view of an exemplary embodiment of a portion of a display device, FIG. 6 is a plan view of an exemplary embodiment of a peripheral area PA including a flexible area BA of FIG. 5 viewed in a direction K, and FIGS. 7A and 7B respectively are a plan view and a cross-sectional view of a peripheral area including a flexible area according to a compared example. Specifically, FIG. 7B is a cross-sectional view of taken along line VIIb-VIIb' of FIG. 7A. For convenience of description, FIG. 5 illustrates a state in which the display device is not bent, and a cross-sectional view of a display area DA of FIG. 5 corresponds to a cross-sectional view of an exemplary embodiment of one pixel taken along lines A-A' and B-B' of FIG. 4.

FIG. 4 is an arrangement view of an exemplary embodiment of locations of the plurality of TFTs and the capacitor of the one pixel of FIG. 3. The arrangement illustrated in FIG. 4 is an arrangement view of one pixel. Pixels which are the same as or similar to the pixel of FIG. 4 may be arranged to the top, the bottom, the left, and the right of the pixel of FIG. 4.

First, a display area DA of FIGS. 4 and 5 is mainly described and then flexible areas BA of FIGS. 5 to 7B are described.

Referring to FIG. 4, a scan line 121, a previous scan line 122, and an emission control line 123 extend in the y-direction, and a data line 171 and driving voltage lines 172 and 178 extend in the x-direction crossing the y-direction.

The driving TFT T1, the switching TFT T2, the compensation TFT T3, the first initialization TFT T4, the operation control TFT T5, the emission control TFT T6, and the second initialization TFT T7 may be disposed on a buffer layer BL (refer FIG. 5).

A driving semiconductor layer 130a corresponding to the driving TFT T1, a switching semiconductor layer 130b corresponding to the switching TFT T2, a compensation semiconductor layer 130c corresponding to the compensation TFT T3, an initialization semiconductor layer 130d corresponding to the first initialization TFT T4, an operation control semiconductor layer 130e corresponding to the operation control TFT T5, an emission control semiconductor layer 130f corresponding to the emission control TFT T6, and a second initialization channel region 130g corresponding to the second initialization TFT T7 may be disposed on the buffer layer BL. These semiconductor layers may be connected to each other, and may be curved in various forms.

In an exemplary embodiment, the semiconductor layers may include polycrystalline silicon, for example. Each of the semiconductor layers may include a channel region not doped with impurities, a source region and a drain region. The source region and the drain region are respectively disposed at opposite sides of the channel region and doped with impurities. The channel region of the semiconductor layer overlaps the scan line 121, the previous scan line 122, or the emission control line 123. The semiconductor layer may be doped with the impurities by using the scan line 121, the previous scan line 122, or the emission control line 123 as a self-align mask. Here, types of the impurities may change depending on a type of a TFT and include N-type impurities or P-type impurities. The channel region, the source region at one side of the channel region, and the drain region at the other side of the channel region may also be referred to as an active layer. That is, a TFT has an active layer and the active layer includes the channel region, the source region, and the drain region.

The doped source region and drain region respectively correspond to a source electrode and a drain electrode of a TFT. In an exemplary embodiment, as illustrated in the display area DA of FIGS. 4 and 5, the driving source electrode may correspond to a driving source region 176a doped with impurities, and the driving drain electrode may correspond to a driving drain region 177a doped with impurities. Hereinafter, for convenience of description, terms of a source region or a drain region are used instead of a source electrode or a drain electrode.

The driving TFT T1 includes a driving gate electrode 125a and the driving semiconductor layer 130a including a driving channel region, the driving source region 176a and the driving drain region 177a. The driving channel region of the semiconductor layer 130a overlaps the driving gate electrode 125a. The driving channel region of the semiconductor layer 130a has a curved form and thus may have a long channel length. Although FIG. 4 illustrates the driving channel region having a curved shape in a form of an "omega," the invention is not limited thereto. The driving gate electrode 125a may serve as the gate electrode of the driving TFT T1 and simultaneously serve as the first storage capacitor plate of the storage capacitor Cst described below. A first gate insulating layer GI1 (refer to FIG. 5) is between the driving semiconductor layer 130a and the driving gate electrode 125a. In an exemplary embodiment, the first gate insulating layer GI1 may be an inorganic layer including SiON, SiOx, and/or SiNx, for example. The driving source region 176a is connected to a switching drain region 177b and an operation control drain region 177e described below, and the driving drain region 177a is connected to a compensation source region 176c and an emission control source region 176f described below.

The switching TFT T2 includes a switching gate electrode 125b and the switching semiconductor layer 130b including sa witching channel region, a switching source region 176b and a switching drain region 177b. The switching channel region of the switching semiconductor layer 130b overlaps the switching gate electrode 125b, and the switching gate electrode 125b corresponds to a portion of the scan line 121 which overlaps the switching channel region of the switching semiconductor layer 130b. The switching source region 176b is electrically connected to the data line 171 via a contact hole 164 defined in the first gate insulating layer GI1, a second gate insulating layer GI2, and an interlayer insulating layer ILD. In an exemplary embodiment, the second gate insulating layer GI2 and the interlayer insulating layer ILD may be inorganic layers including SiON, SiOx, and/or SiNx, for example. The switching drain region 177b is connected to the driving TFT T1 and the operation control TFT T5.

The compensation TFT T3 includes compensation gate electrodes 125c1 and 125c2 and the compensation semiconductor layer 130c including a compensation channel region, a compensation source region 176c and a compensation drain region 177c. The compensation channel region of the compensation semiconductor 130c overlaps the compensation gate electrodes 125c1 and 125c2. The compensation gate electrodes 125c1 and 125c2 correspond to a portion of the scan line 121 which overlaps the compensation channel region of the compensation semiconductor 130c. The compensation gate electrodes 125c1 and 125c2 are dual gate electrodes including the first gate electrode 125c1 and the second gate electrode 125c2 and may prevent or reduce the occurrence of a leakage current. The compensation drain region 177c may be connected to the first storage capacitor plate 125a of the storage capacitor Cst via a connection member 174. The first storage capacitor plate 125a of the storage capacitor Cst may also serve as the gate electrode of the driving TFT T1 described above.

The connection member 174 may include the same material as that of the data line 171 and may be in the same layer as a layer in which the data line 171 is disposed. One end of the connection member 174 may be electrically connected to the compensation drain region 177c and the initialization drain region 177d via a contact hole 166 defined in the first and second gate insulating layers GI1 and GI2 and the interlayer insulating layer ILD. The other end of the connection member 174 may be electrically connected to the first storage capacitor plate 125a via a contact hole 167 defined in the second gate insulating layer GI2 and the interlayer insulating layer ILD. The other end of the connection member 174 may also be connected to the first storage capacitor plate 125a via a storage capacitor opening 127a in a second storage capacitor plate 127.

The first initialization TFT T4 includes first initialization gate electrodes 125d1 and 125d2 and the first initialization semiconductor layer 130d including a first initialization channel region, a first initialization source region 176d and a first initialization drain region 177d. The first initialization channel region of the first initialization semiconductor layer 130d overlaps the first initialization gate electrodes 125d1 and 125d2. The first initialization gate electrodes 125d1 and 125d2 correspond to portions of the previous scan line 122 which overlap the first initialization channel region of the first initialization semiconductor layer 130d. The first initialization gate electrodes 125d1 and 125d2 are dual gate electrodes including the first gate electrode 125d1 and the second gate electrode 125d2 and may prevent or reduce the occurrence of a leakage current. The first initialization source region 176d is connected to an initialization voltage line 124 via an initialization connection line 173. The initialization voltage line 124 includes the same material as that of the second storage capacitor plate 127 and may be in the same layer in which the second storage capacitor plate 127 is disposed. One end of the initialization connection line 173 may be electrically connected to the initialization voltage line 124 via a contact hole 161 defined in the second gate insulating layer GI2 and the interlayer insulating layer ILD. The other end of the initialization voltage line 124 may be electrically connected to the initialization source region 176d via a contact hole 162 defined in the first gate insulating layer GI1, the second gate insulating layer GI2, and the interlayer insulating layer ILD.

The operation control TFT T5 includes an operation control gate electrode 125e and the operation control semiconductor layer 130e including an operation control channel region, an operation control source region 176e and an operation control drain region 177e. The operation control channel region of the operation control semiconductor layer 130e overlaps the operation control gate electrode 125e. The operation control gate electrode 125e corresponds to a portion of the emission control line 123 which overlaps the operation control channel region of the operation control semiconductor layer 130e. The operation control source region 176e may be electrically connected to a lower driving voltage line 172 via a contact hole 165 defined in the first and second gate insulating layer GI1 and GI2 and the interlayer insulating layer ILD. In this case, a portion neighboring the contact hole 165 of the lower driving voltage line 172 may correspond to the source region 176e, that is, the source electrode of the operation control TFT T5.

The emission control TFT T6 includes an emission control gate electrode 125f and the emission control semiconductor layer 130f including an emission control channel region, an emission control source region 176f and an emission control drain region 177f. The emission control channel region of the emission control semiconductor layer 130f overlaps the emission control gate electrode 125f. The emission control gate electrode 125f corresponds to a portion of the emission control line 123 which overlaps the emission control channel region of the emission control semiconductor layer 130f. The emission control drain region 177f may be electrically connected to an intermediate connection layer 175 on the interlayer insulating layer ILD via a contact hole 163 defined in the first and second gate insulating layers GI1 and GI2 and the interlayer insulating layer ILD. The intermediate connection layer 175, the data line 171 and the lower driving voltage line 172 may be disposed on the interlayer insulating layer ILD. The intermediate layer 175 is electrically connected to an auxiliary connection layer 179 via a contact hole 183. The auxiliary connection layer 179 is electrically connected to a pixel electrode 310 of an OLED via a contact hole 185.

The second initialization TFT T7 includes a second initialization gate electrode 125g and the second initialization semiconductor layer 130g including a second initialization channel region, a second initialization source region 176g and a second initialization drain region 177g. The second initialization channel region of the second initialization semiconductor layer 130g overlaps the second initialization gate electrode 125g. The second initialization gate electrode 125g corresponds to a portion of the previous scan line 122 which overlaps the second initialization channel region of the second initialization semiconductor layer 130g. The second initialization source region 176g is connected to the emission control drain electrode D6 of the emission control TFT T6 and the pixel electrode 310 of the OLED. The second initialization drain region 177g is connected to the first initialization source electrode S4 of the first initialization TFT T4 and the initialization voltage line 124. The second initialization TFT T7 is turned on in response to a previous scan signal transferred via the previous scan line 122 and initializes the pixel electrode 310 of the OLED.

The storage capacitor Cst includes the first storage capacitor plate 125a and the second storage capacitor plate 127. The second storage capacitor plate 127 overlaps the first storage capacitor plate 125a with the second gate insulating layer GI2 therebetween.

In an exemplary embodiment, the scan line 121, the previous scan line 122, the emission control line 123, and the driving gate electrodes 125a which also serves as the first storage capacitor plate may be directly on the same layer such as the first gate insulating layer GI1 as illustrated in the display area DA of FIG. 5. In an exemplary embodiment, the scan line 121, the previous scan line 122, the emission control line 123, and the driving gate electrodes 125a which also serves as the first storage capacitor plate may include at least one of Mo, Al, Cu, Ti, etc. and include a single layer or a multi-layer. For example, the scan line 121, the previous scan line 122, the emission control line 123, and the driving gate electrodes 125a which also serves as the first storage capacitor plate may be a single layer including Mo.

In an exemplary embodiment, the second storage capacitor plate 127 and the initialization voltage line 124 may be directly on the same layer such as the second gate insulating layer GI2 as illustrated in the display area DA of FIG. 5. In an exemplary embodiment, the second storage capacitor plate 127 and the initialization voltage line 124 may include at least one of Mo, Al, Cu, Ti, etc. and include a single layer or a multi-layer. For example, the second storage capacitor plate 127 and the initialization voltage line 124 may be a single layer including Mo or a multi-layer including Mo/Al/Mo.

In an exemplary embodiment, the data line 171, the lower driving voltage line 172, the initialization connection line 173, the connection line 174, and the intermediate connection layer 175 may be directly on the same layer such as the interlayer insulating layer ILD as illustrated in the display area DA of FIG. 5. The data line 171, the lower driving voltage line 172, the initialization connection line 173, the connection line 174, and the intermediate connection layer 175 may include the same material. In an exemplary embodiment, the data line 171, the lower driving voltage line 172, the initialization connection line 173, the connection line 174, and the intermediate connection layer 175 may include, for example, at least one of Mo, Al, Cu, and Ti and include a single layer or a multi-layer. In an exemplary embodiment, the data line 171, the lower driving voltage line 172, the initialization connection line 173, the connection line 174, and the intermediate connection layer 175 may have a multi-layered structure including Ti/Al/Ti.

The lower driving voltage line 172 is electrically connected to the upper driving voltage line 178. In an exemplary embodiment, for example, the lower driving voltage line 172 is electrically connected to the upper driving voltage line 178 via a contact hole 181 defined in a first organic insulating layer PL1 between the lower driving voltage line 172 and the upper driving voltage line 178. The driving voltage lines 172 and 178 supply a constant electric signal, that is, the driving voltage ELVDD to a plurality of pixels. To implement a display device providing a high quality image, it is desirable that a voltage drop of the driving voltage lines 172 and 178 should not occur. Since the driving voltage line of the exemplary embodiment has the lower and upper driving voltage lines electrically connected each other, for example, the upper driving voltage line 178 is electrically connected to the lower driving voltage line 172 according to an exemplary embodiment, the resistance of the driving voltage line of the exemplary embodiment may be reduced or minimized. Therefore, the voltage drop due to resistance of the driving voltage lines 172 and 178 may be effectively reduced even if an area of a pixel P is reduced in order to implement a high resolution display device.

In an exemplary embodiment, the upper driving voltage line 178 may include at least one of Mo, Al, Cu, Ti, for example, and include a single layer or a multi-layer. In an exemplary embodiment, the upper driving voltage line 178 may have a multi-layered structure including Ti/Al/Ti, for example.

As illustrated in FIG. 5, a passivation layer PVX may be on the data line 171, the lower driving voltage line 172, the initialization connection line 173, the connection member 174, and the intermediate connection layer 175. In an exemplary embodiment, the passivation layer PVX may include, for example, SiNx. Since hydrogen of SiNx combines with a dangling bond of a semiconductor layer, and removes a defect site of the semiconductor layer, electrical characteristics of TFTs can be improved.

Though not shown, the passivation layer PVX may cover a portion of wirings exposed from the peripheral area PA and protect the wirings. For example, at least a portion of the wirings 21, 31, 51, 61, and 71 without the passivation layer PVX may be exposed from a portion of the peripheral area PA, and the exposed portion may be damaged by etchant used while the pixel electrode 310 (see FIG. 5) is patterned. However, according to an exemplary embodiment, the passivation layer PVX may protect the wirings 21, 31, 51, 61, and 71 by covering the portion of the wirings 21, 31, 51, 61, and 71.

The upper driving voltage line 178 and the auxiliary connection line 179 may be covered with a second organic insulating layer PL2. The first and second organic insulating layers PL1 and PL2 may include an organic material. In an exemplary embodiment, the organic material may include a general-purpose polymer such as an imide-based polymer, polymethylmethacrylate ("PMMA") or polystyrene ("PS"), or polymer derivatives having a phenol-based group, an acryl-based polymer, an aryl ether-based polymer, an amide-based polymer, a fluorine-based polymer, a p-xylene-based polymer, a vinyl alcohol-based polymer, or a blend thereof.

The OLED may be on the second organic insulating layer PL2. The OLED may include the pixel electrode 310, an opposite electrode 330, and an intermediate layer 320 therebetween. The intermediate layer 320 may include an emission layer.

A pixel-defining layer 150 may be disposed on the pixel electrode 310. The pixel-defining layer 150 defines a pixel by including an opening corresponding to each sub-pixel, that is, an opening exposing at least a central portion of the pixel electrode 310. Also, the pixel-defining layer 150 may prevent an arc, etc. from occurring between the pixel electrode 310 and the opposite electrode 330 by increasing a distance between an edge of the pixel electrode 310 and the opposite electrode 330. In an exemplary embodiment, the pixel-defining layer 150 may include an organic material such as polyimide ("PI") or hexamethyldisiloxane ("HMDSO").

In an exemplary embodiment, the intermediate layer 320 may include a low molecular or polymer material. In the case where the intermediate layer 320 includes a low molecular material, the intermediate layer 320 may have a structure in which a hole injection layer ("HIL"), a hole transport layer ("HTL"), an emission layer ("EML"), an electron transport layer ("ETL"), an electron injection layer ("EIL"), etc. are stacked in a single or a composite configuration, and may include various organic materials such as copper phthalocyanine ("CuPc"), N,N'-Di(naphthalene-1- yl)-N,N'-diphenyl-benzidine ("NPB"), and tris-8-hydroxyquinoline aluminum ("Alq3"). These layers may be provided by vacuum evaporation.

In the case where the intermediate layer 320 includes a polymer material, the intermediate layer 320 may have a structure including an HTL and an EML, for example. In this case, the HTL may include a PEDOT, and the EML may include a polymer material such as polyphenylene vinylene ("PPV")-based material and a polyfluorene-based material. The structure of the intermediate layer 320 is not limited to the above-described structure but may have various structures. In an exemplary embodiment, for example, the intermediate layer 320 may be one layer which covers a plurality of pixel electrodes 310 or may include layers, each of which is patterned to correspond to each of the plurality of pixel electrodes 310.

The opposite electrode 330 may be disposed in upper part of the display area DA and cover the display area DA. That is, the opposite electrode 330 may have one body which covers a plurality of OLEDs and correspond to the plurality of pixel electrodes 310.

Since the OLED may be easily damaged by external moisture or oxygen, the OLED may be protected by being covered with an encapsulation layer 400. The encapsulation layer 400 may cover the display area DA and extend to an outside of the display area DA. The encapsulation layer 400 may include a first inorganic encapsulation layer 410, an organic encapsulation layer 420, and a second inorganic encapsulation layer 430.

In an exemplary embodiment, the first inorganic encapsulation layer 410 may cover the opposite electrode 330 and include SiOx, SiNx, and/or SiON, for example. Though not shown, other layers such as a capping layer may be disposed between the first inorganic encapsulation layer 410 and the opposite electrode 330. Since the first inorganic encapsulation layer 410 may be disposed along an uneven structure thereunder and have the same thickness along the display area DA, an upper surface of the first inorganic encapsulation layer 410 may not be planar. The organic encapsulation layer 420 covers the first inorganic encapsulation layer 410. Unlike the first inorganic encapsulation layer 410, the organic encapsulation layer 420 may have a variable thickness along the display area DA such that an upper surface of the organic encapsulation layer 420 corresponding to the display area DA may be approximately planar. In an exemplary embodiment, the organic encapsulation layer 420 may include at least one of polyethylene terephthalate ("PET"), polyethylene naphthalate ("PEN"), polycarbonate ("PC"), PI, polyethylene sulfonate, polyoxymethylene ("POM"), polyarylate, and HMDSO, for example. In an exemplary embodiment, the second inorganic encapsulation layer 430 may cover the organic encapsulation layer 420 and include SiOx, SiNx, and/or SiON, for example.

By virtue of the above-described multi-layered structure of the encapsulation layer 400, even when a crack occurs inside the encapsulation layer 400, the encapsulation layer 400 may prevent the crack from being transferred between the first inorganic encapsulation layer 410 and the organic encapsulation layer 420, or between the organic encapsulation layer 420 and the second inorganic encapsulation layer 430. Therefore, the encapsulation layer 400 may prevent or minimize forming of a path through which external moisture or oxygen penetrates into the display area DA. Though not shown, a polarization plate may be disposed on the encapsulation layer 400 by using a light transmission adhesive. The polarization plate is a structure for reducing external light reflection. Instead of the polarization plate, a layer including a black matrix and a color filter may be used.

Referring to the peripheral area PA around the flexible area BA of FIG. 5, the buffer layer BL, the first and second gate insulating layers GI1 and GI2, and the interlayer insulating layer ILD on the substrate 100 may be collectively referred to as inorganic insulating layers IL. In an exemplary embodiment, the inorganic layers IL may include an inorganic material such as SiOx, SiNx, and/or SiON. FIG. 5 illustrates that an inorganic insulating layer IL in the peripheral area PA around the flexible area BA includes the buffer layer BL, the first and second gate insulating layers GI1 and GI2, and the interlayer insulating layer ILD. In another exemplary embodiment, the inorganic insulating layer IL may include at least one of the buffer layer BL, the first and second gate insulating layers GI1 and GI2, and the interlayer insulating layer ILD, for example.

The inorganic insulating layer IL includes an opening OP corresponding to the flexible area BA. The buffer layer BL, the first and second gate insulating layers GI1 and GI2, and the interlayer insulating layer ILD may respectively define openings op1, op2, op3, and op4 corresponding to the flexible area BA.

If the inorganic insulating layer IL is continuously provided from the first area 1A to the second area 2A without the opening OP in the flexible area BA, while the display device 1 is bent, stress may be applied to the inorganic insulating layer IL. Since, unlike an organic layer, an inorganic layer has a high hardness, a crack may easily occur in the inorganic insulating layer IL due to the bending of the display device 1. In the case where a crack occurs in the inorganic insulating layer IL, a crack, etc. may also occur in first and second conductive layers 213a and 213b disposed on the inorganic insulating layer IL and cause a defect such as disconnection.

However, according to an exemplary embodiment of the invention, since the inorganic insulating layer IL includes the opening OP, the inorganic insulating layer IL may prevent or reduce the occurrence of a crack, etc. by stress efficiently. In this case, the opening OP has a width OW in the x-direction which is greater than the width of the flexible area BA and thus minimizes a defect by a crack.

The substrate 100 may have a flexible or bendable characteristic by including at least one plastic layer. The substrate 100 may include a first plastic layer 101 and a second plastic layer 105. The substrate 100 may include a first barrier layer 103 and a second barrier layer 107. The first barrier layer 103 may be disposed between the first plastic layer 101 and the second plastic layer 105, and the second barrier layer 107 may be disposed between the second plastic layer 105 and the buffer layer BL.

In an exemplary embodiment, the first and second plastic layers 101 and 105 may include at least one of PI, polyether sulphone ("PES"), polyacrylate, polyether imide ("PEI"), PEN, PET, polyphenylene sulfide ("PPS"), polyarylate, PC, tri-cellulose acetate ("TAC"), cellulose acetate propionate ("CAP"), cyclic olefin polymer, and cyclic olefin copolymer, for example.

In an exemplary embodiment, the first and second barrier layers 103 and 107 may include an inorganic material such as SiOx, SiNx, and/or SiON and prevent external impurities from penetrating into the first and second plastic layers 101 and 105 and damaging or deteriorating a TFT.

The second barrier layer 107 may define an opening 107a corresponding to the flexible area BA. The second plastic layer 105 of the substrate 100 may be exposed via the opening 107a of the second barrier layer 107. Like the above description, to prevent the occurrence of a crack by the stress to the second barrier layer 107 while the display device 1 is bent, the second barrier layer 107 may have the opening 107a corresponding to the opening OP of the inorganic insulating layer IL. In the present specification, "correspond" may be understood as "overlap."

Although FIG. 5 illustrates that inner lateral surfaces of the opening op1 defined by the buffer layer BL, the opening op2 defined by the first gate insulating layer GI1, the opening op3 defined by the second gate insulating layer GI2, the opening op4 defined by the interlayer insulating layer ILD, and the opening 107a defined by the second barrier layer 107 coincide with each other, the invention is not limited thereto. In another exemplary embodiment, the inner lateral surfaces of the openings op1, op2, op3, op4, and 107a may not coincide with each other, and the openings op1, op2, op3, op4, and 107a may respectively have different sizes. In this case, the opening OP of the inorganic insulating layer IL may be defined as one of the openings having a smallest size from among the openings op1, op2, op3, op4, and 107a.

The first conductive layer 213a and the second conductive layer 213b are spaced apart from each other on the inorganic insulating layer IL, for example, the interlayer insulating layer ILD. The first conductive layer 213a is separated from the second conductive layer 213b with the opening OP defined by the inorganic insulating layer IL therebetween. The first conductive layer 213a and the second conductive layer 213b separated from each other are electrically connected by a connection conductive layer 215 on the first organic insulating layer PL1. A structure of the first conductive layer 213a and the second conductive layer 213b separated from each other in the flexible area BA and a structure of the connection conductive layer 215 connecting the first conductive layer 213a to the second conductive layer 213b may correspond to a structure of at least one of the wirings 21, 31, 51, 61, and 71.

The first conductive layer 213a and the second conductive layer 213b are disposed on the same layer which may be a similar layer with the layers on which the data line 171 and the lower driving voltage line 172 are disposed and include the same material as that of one of the data line 171 and the lower driving voltage line 172. The connection conductive layer 215 is disposed on the same layer as a layer on which the upper driving voltage line 178 and the auxiliary connection layer 179 are disposed and includes the same material as that of one of the upper driving voltage line 178 and the data line 171. The passivation layer PVX may be disposed between the first or second conductive layers 213a or 213b and the connection conductive layer 215, specifically, between the first or second conductive layers 213a or 213b and the first organic insulating layer PL1. The passivation layer PVX defines an opening PVX-op corresponding to the opening OP defined by the inorganic insulating layer IL and defines holes PVX-h for contact between the first and second conductive layers 213a and 213b and the connection conductive layer 215. The connection conductive layer 215 contacts the first and second conductive layers 213a and 213b via a contact hole CNT. The passivation layer PVX may protect a portion of a wiring, for example, a portion of the first and second conductive layers 213a and 213b not covered with the first and second organic insulating layers PL1 and PL2 in other regions not shown in FIG. 5 in the peripheral area PA.

The first and second conductive layers 213a and 213b may be provided by forming a conductive material layer (not shown) on the inorganic insulating layer IL defining the opening OP and then etching the same. In an exemplary embodiment, the inorganic insulating layer IL may have a thickness from about 20,000 angstroms (Å) to about 24,000 Å, for example. In this case, a portion of the conductive material layer (not shown) in the opening OP of the inorganic insulating layer IL may remain due to a step difference of the inorganic insulating layer IL and thus a remnant pattern 213s may remain on the second barrier layer 107. As illustrated in FIG. 6 and the peripheral area PA of FIG. 5, the remnant pattern 213s is near to an edge of the opening OP, that is, an inner lateral surface of the inorganic insulating layer IL. Hereinafter, for convenience of description, a state in which the remnant pattern 213s exists is mainly described.

If a first conductive layer is not spaced apart from a second conductive layer in the opening of the inorganic insulating layer therebetween, that is, if a conductive layer 2213 extends without disconnection in the opening OP of the inorganic insulating layer IL as illustrated in FIGS. 7A and 7B, a short-circuit may occur between adjacent conductive layers 2213 due to a remnant pattern 2213s remaining between the adjacent conductive layers 2213. Here, each conductive layer 2213 may be at least one of the wirings 21, 31, 51, 61, and 71 described above with reference to FIG. 1. In this case, a normal operation of the display device 1 is impossible.

However, according to an exemplary embodiment of the invention as described above, the first conductive layer 213a and the second conductive layer 213b are spaced apart from each other, thereby avoiding a short-circuit with the remnant pattern 213s and electrically connected via the connection conductive layer 215. Therefore, in an exemplary embodiment, a wiring, for example, the wirings 21, 31, 51, 61, and 71 described above with reference to FIG. 1 may easily perform their functions without an unnecessary electric short-circuit. Although FIG. 5 illustrates a state in which a third conductive layer 213c is patterned in the opening OP, the third conductive layer 213c may be omitted. The third conductive layer 213c may have the same material as that of the first conductive layer 213a and the second conductive layer 213b.

Referring to FIG. 5, a portion of the first organic insulating layer PL1 disposed between the first and second conductive layers 213a and 213b and the connection conductive layer 215 fills at least a portion of the opening OP of the inorganic insulating layer IL. The portion of the first organic insulating layer PL1 is disposed inside the opening OP of the inorganic insulating layer IL. At least a portion of the first organic insulating layer PL1 inside the opening OP of the inorganic insulating layer IL may directly contact the second plastic layer 105 via the opening OP and the opening 107a of the second barrier layer 107. Also, the connection conductive layer 215 may be covered with the second organic insulating layer PL2 and the pixel-defining layer 150. Although FIG. 5 illustrates a structure in which the pixel-defining layer 150 extends to only the display area DA, the pixel-defining layer 150 may extend to the flexible area BA in another exemplary embodiment.

A probability that a crack occurs in the first and second organic insulating layers PL1 and PL2 is low in view of a characteristic of the first and second organic insulating layers PL1 and PL2 including an organic material. Therefore, the first and second organic insulating layers PL1 and PL2 may effectively prevent or minimize the occurrence of a crack in a portion of the connection conductive layer 215 corresponding to the flexible area BA. Also, since the first and second organic insulating layers PL1 and PL2, which are organic layers, have a lower hardness than that of an inorganic layer, the first and second organic insulating layers PL1 and PL2 may absorb tensile stress occurring due to the bending of the display device 1 and thus effectively minimize concentration of the tensile stress on the first and second conductive layers 213a and 213b and/or the connection conductive layer 215.

Figure 8:
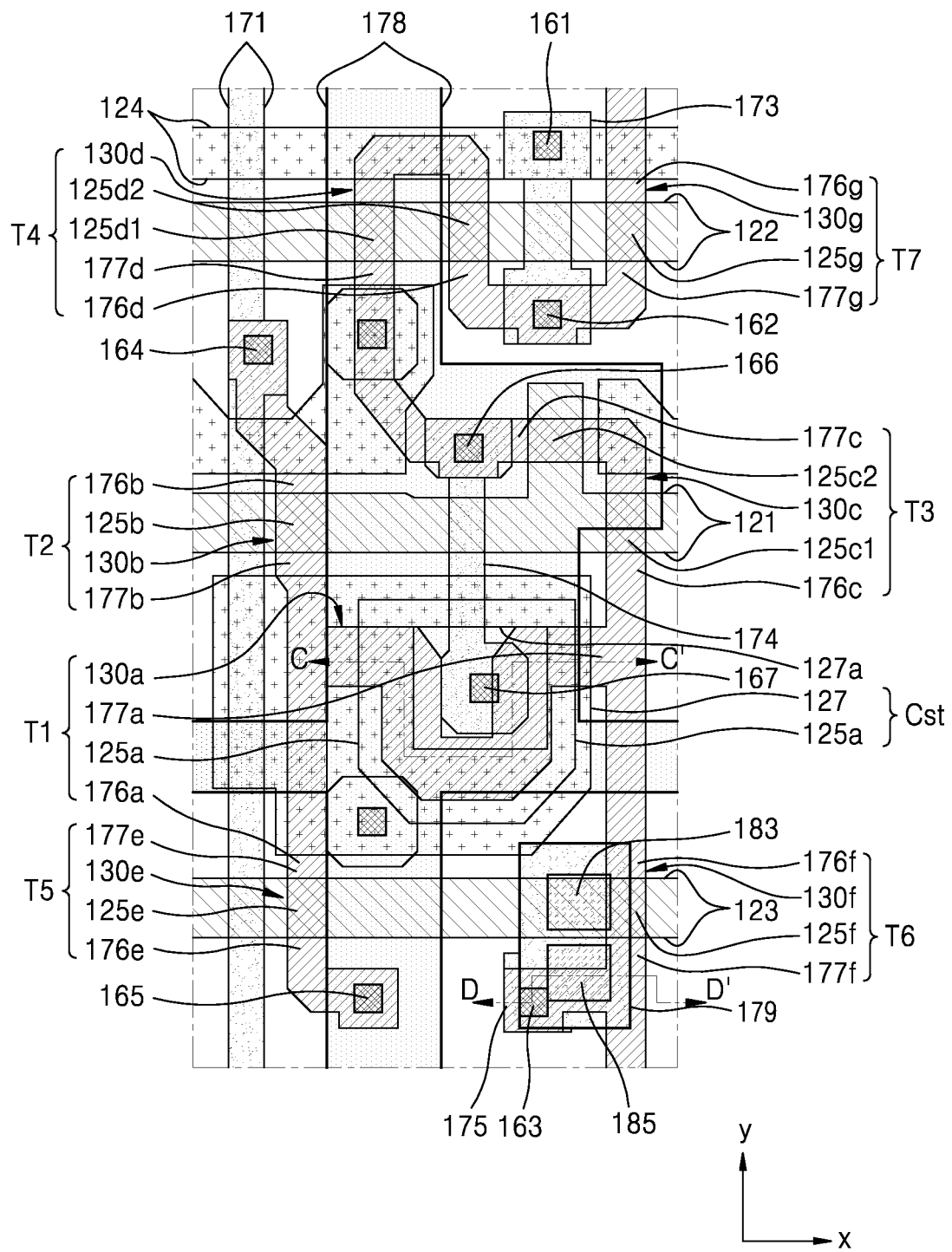
FIG. 8 is a plan view of another exemplary embodiment of one pixel of a display device.
Figure 9:
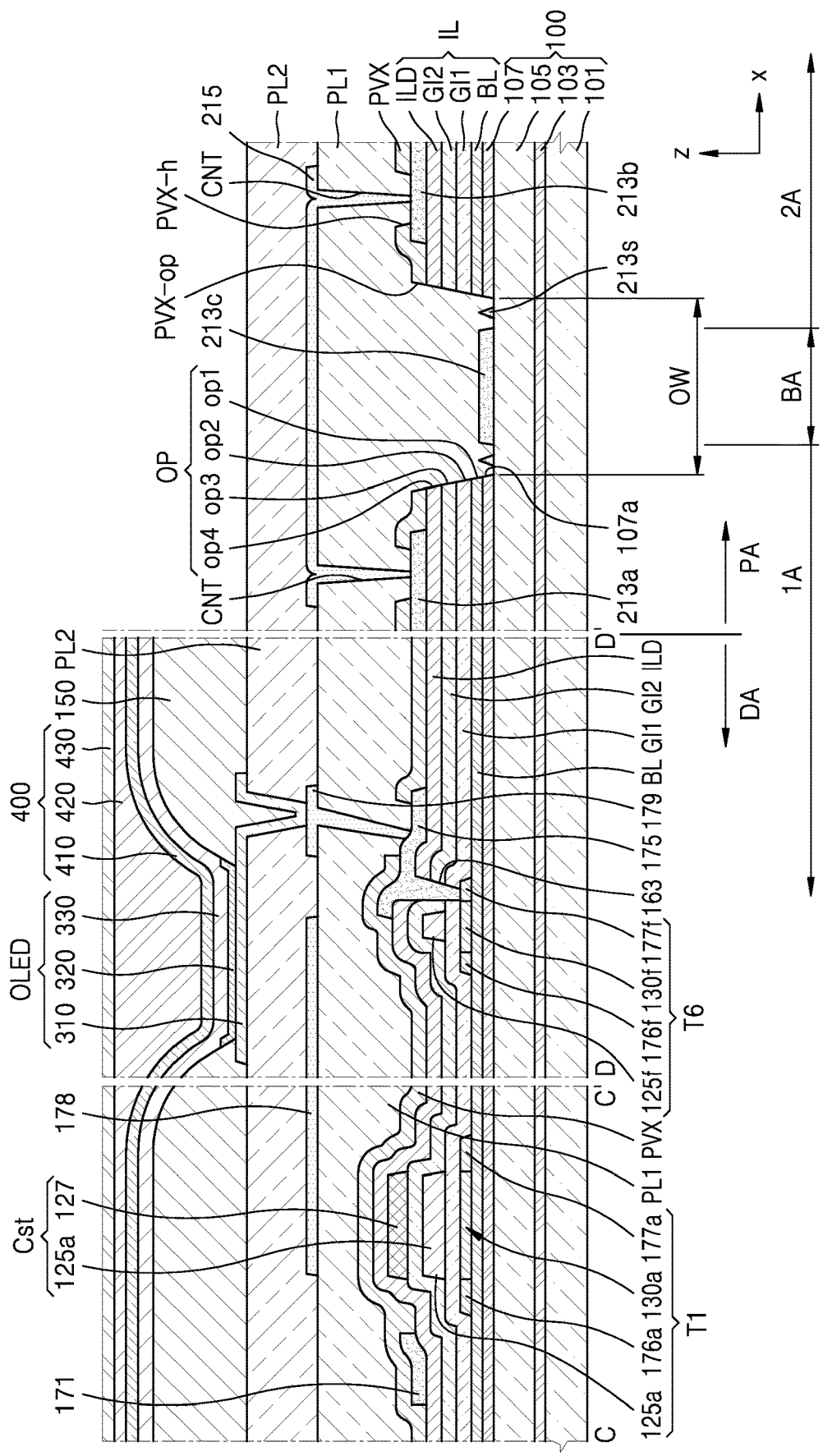
FIG. 9 is a cross-sectional view of another exemplary embodiment of a portion of a display device.

FIG. 8 is a plan view of another exemplary embodiment of one pixel in a display area of a display device, and FIG. 9 is a cross-sectional view of another exemplary embodiment of a portion of a display device. For convenience of description, FIG. 9 illustrates a state in which the display device is not bent, and the cross-sectional view of the display area DA of FIG. 9 corresponds to a cross-sectional view of another exemplary embodiment of one pixel of the display device taken along lines C-C' and D-D' of FIG. 8.

Although FIGS. 4 and 5 illustrate a case where the driving voltage line of the display device 1 includes double layers including the upper driving voltage line 178 and the lower driving voltage line 172, the invention is not limited thereto.

As illustrated in FIGS. 8 and 9, the driving voltage line may be a single layer including the upper driving voltage line 178. The upper driving voltage line 178 of FIG. 9 may resolve a problem of a voltage drop, etc. by having a greater area than that of the upper driving voltage line 178 of FIGS. 4 and 5. Since the driving voltage line of FIGS. 8 and 9 is the same as the driving voltage line described above with reference to FIGS. 4 and 5 except that the driving voltage line of FIGS. 8 and 9 includes a single layer of the upper driving voltage line 178, repeated descriptions of other constructions are omitted.

Figure 10:
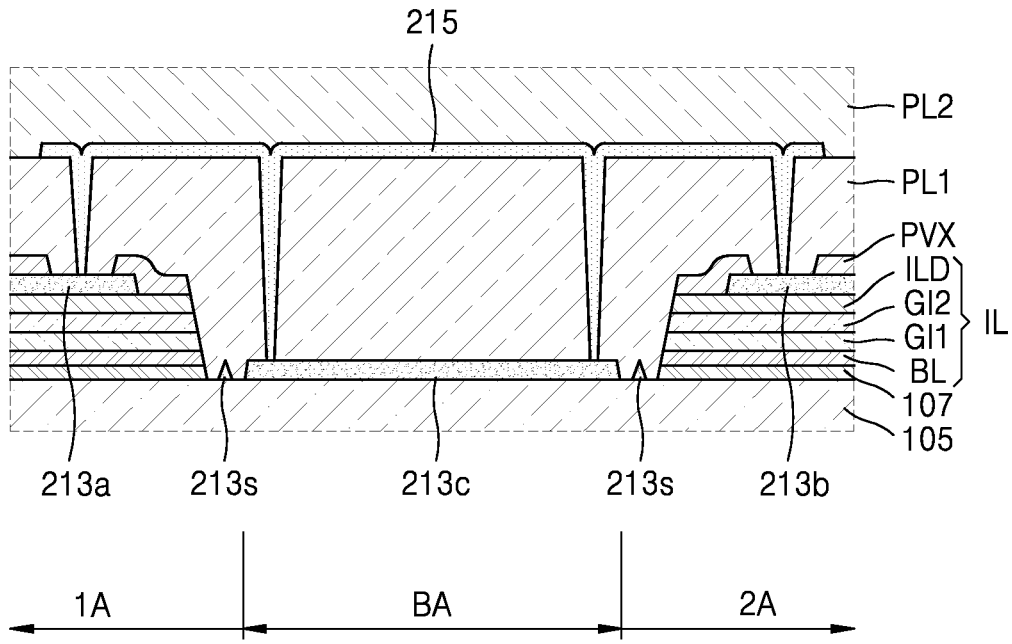
FIGS. 10 to 12 are cross-sectional views of other exemplary embodiments of a portion of a peripheral area of a display device.
Figure 11:
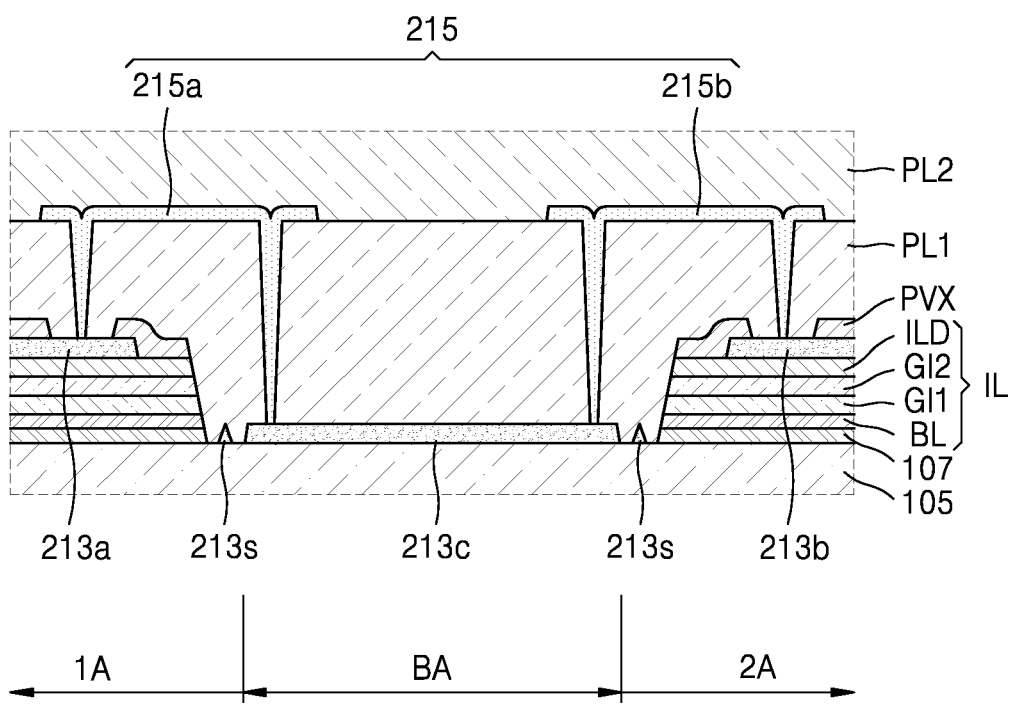
Figure 12:
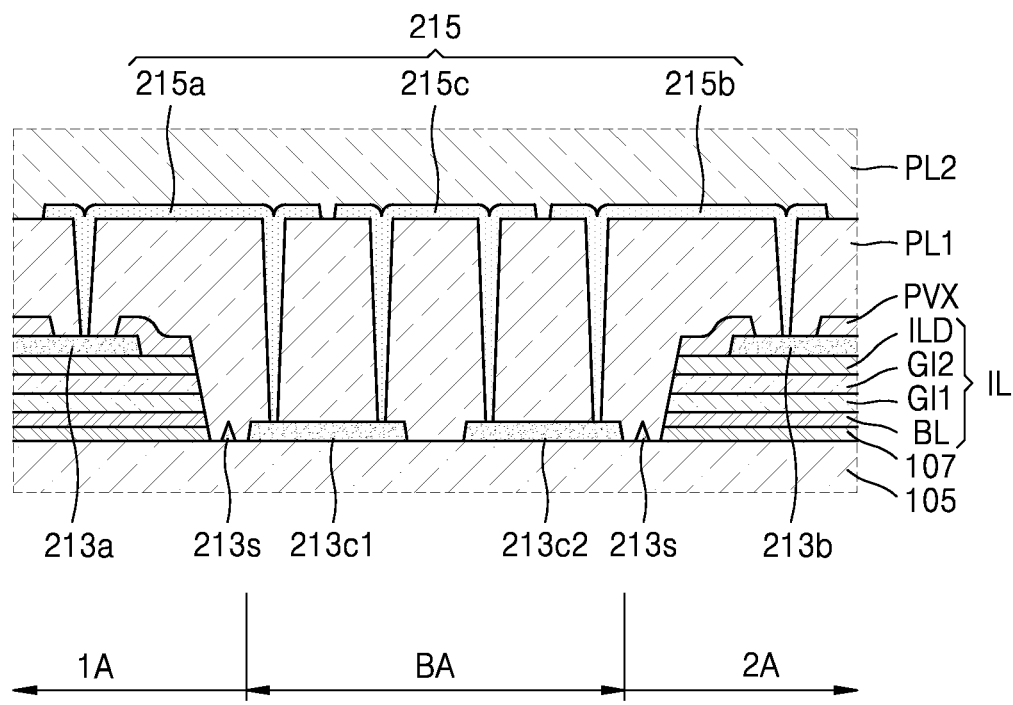
Figure 13:
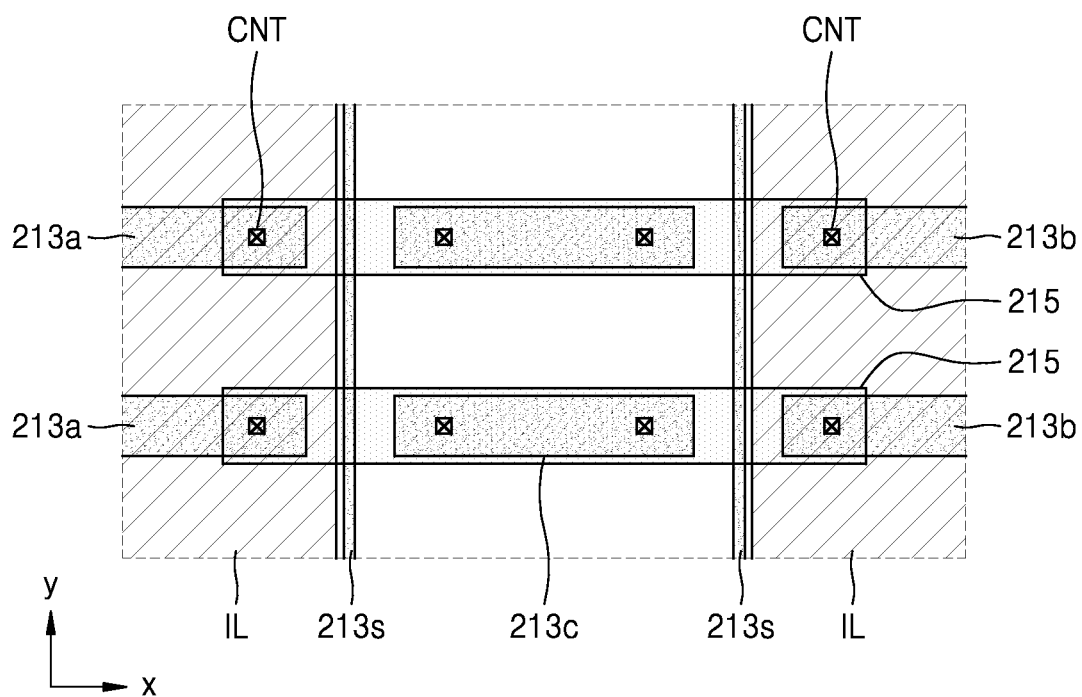
FIGS. 13 to 15 respectively are plan views of FIGS. 10 to 12.
Figure 14:
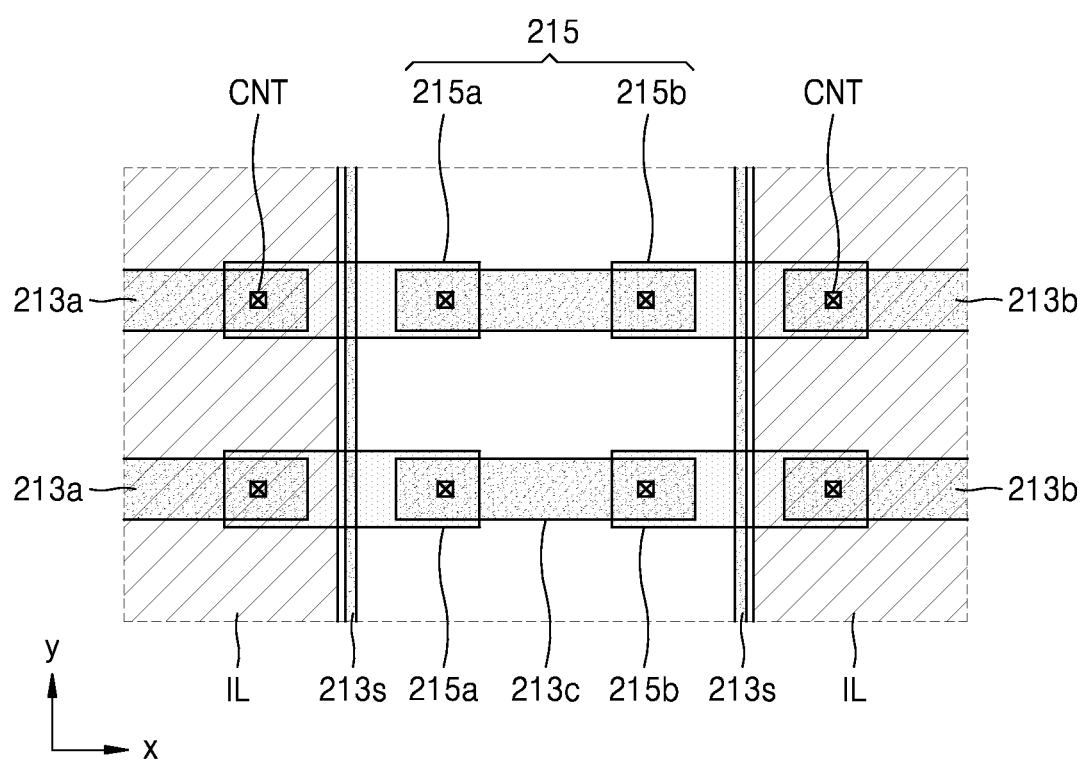
Figure 15:
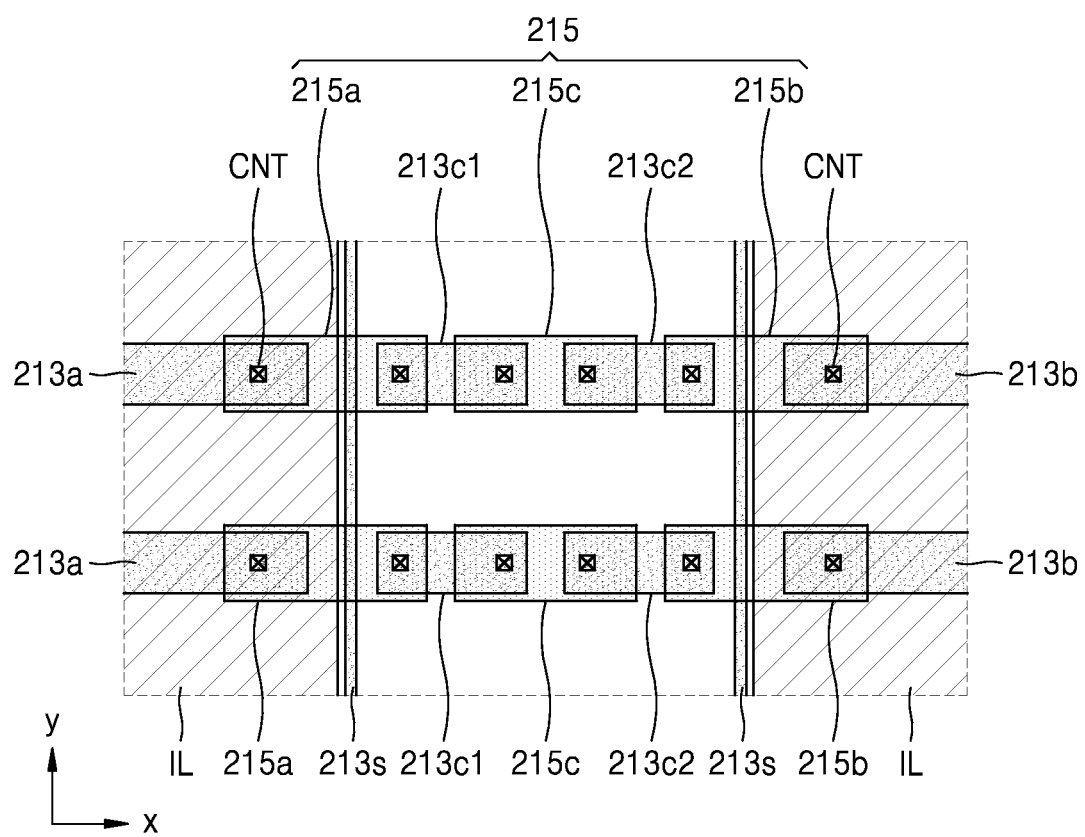

FIGS. 10 to 12 are cross-sectional views of other exemplary embodiments of a portion of a peripheral area of a display device, and FIGS. 13 to 15 respectively are plan views of FIGS. 10 to 12. Since exemplary embodiments of a display device illustrated in FIGS. 10 to 12 have the same structure as the exemplary embodiment described above with reference to FIGS. 5 and 9 with only differences in the structure around the flexible area BA of the display device, only the peripheral area PA around the flexible area BA is illustrated in FIGS. 10 to 12 for convenience of description.

Referring to FIGS. 10 and 13, the connection conductive layer 215 electrically connecting the first and second conductive layers 213a and 213b may also electrically connect the third conductive layer 213c in the opening OP to the first and second conductive layers 213a and 213b.

Referring to FIGS. 11 and 14, the connection conductive layer 215 may include first and second connection conductive layers 215a and 215b which are spaced apart from each other. The first connection conductive layer 215a may electrically connect the first conductive layer 213a to the third conductive layer 213c. The second connection conductive layer 215b may electrically connect the third conductive layer 213c to the second conductive layer 213b.

Referring to FIGS. 12 and 15, third conductive layers 213c1 and 213c2 which are spaced apart from each other may be disposed in the opening OP. In this case, the connection conductive layer 215 may include first to third connection conductive layers 215a, 215b, and 215c which are spaced apart from each other. The first connection conductive layer 215a may electrically connect the first conductive layer 213a to the third conductive layer 213c1 disposed near to the first conductive layer 213a. The second connection conductive layer 215b may electrically connect the second conductive layer 213b to the third conductive layer 213c2 disposed near to the second conductive layer 213b. The third connection conductive layer 215c may electrically connect the conductive layers 213c1 and 213c2.

As illustrated in FIGS. 11, 14, 12, and 15, in the case where the connection conductive layer 215 includes a plurality of connection conductive layers spaced apart from each other, a probability that a crack, etc. occur due to tensile stress applied to the connection conductive layer 215 while the display device is bent may be reduced more than in the case where the connection conductive layer is one monolithic layer.

Although the disclosure has been described with reference to the exemplary embodiments illustrated in the drawings, this is merely provided as an example and it will be understood by those of ordinary skill in the art that various changes in form and details and equivalents thereof may be made therein without departing from the spirit and scope of the disclosure as defined by the following claims.

What is claimed is:

1. A display device comprising:
    a substrate having a bending area that bends about a bending axis, and a first area and a second area that are respectively at opposite sides of the bending area;
    a plurality of pixels, each including a display element and a transistor;
    a first insulating layer on the substrate, the first insulating layer defining an opening in the bending area;
    a second insulating layer over the first insulating layer, a first portion of the second insulating layer being between the transistor and the display element and a second portion of the second insulating layer covering the opening; and
    a plurality of lines crossing the bending area, at least one of the plurality of lines comprising:
    a first conductive line in the first area;
    a second conductive line in the second area; and
    a connection conductive line over the second portion of the second insulating layer, the connection conductive line being electrically connected to the first and second conductive lines via contact holes defined in the second portion of the second insulating area.

2. The display device of claim 1, wherein the second insulating layer comprises an organic insulating material.

3. The display device of claim 2, wherein the second portion of the second insulating layer at least partially fills the opening of the first insulating layer.

4. The display device of claim 1, wherein the first insulating layer comprises an inorganic insulating material.

5. The display device of claim 1, further comprising:
    a storage capacitor that is electrically connected to the transistor and includes a first electrode and a second electrode;
    a data line electrically connected to the transistor; and
    a driving voltage line electrically connected to the transistor,
    wherein at least one of the first or second conductive lines comprises same material as one of the first and second electrode, the data line, or the driving voltage line.

6. The display device of claim 1, wherein the at least one of the first or second conductive lines comprises at least one of Mo, Al, Cu, or Ti.

7. The display device of claim 1, further comprising a connection layer disposed between the transistor and a pixel electrode of the display element, and
    wherein the connection conductive line comprises same material as the connection layer.

8. The display device of claim 1, wherein the connection conductive line comprises at least one of Mo, Al, Cu, or Ti.

9. The display device of claim 1, further comprising a conductor disposed in the opening, the conductor being apart from the first and second conductive lines.

10. The display device of claim 9, wherein a part of the connection conductive line overlaps the conductor.

11. The display device of claim 9, wherein the connection conductive line is connected to the conductor via at least one second contact hole that is defined in the second portion of the second insulating layer.

12. The display device of claim 11, wherein the connection conductive line comprises a first sub-connection conductive line and a second sub-connection conductive line that are separated from each other, and wherein:
 the first sub-connection conductive line electrically connects the first conductive line to a first portion of the conductor, and
 the second sub-connection conductive line electrically connects the second conductive line to a second portion of the conductor.

13. The display device of claim 12, wherein the first portion of the conductor and the second portion of the conductor are separated from each other.

14. The display device of claim 12, wherein the first portion of the conductor and the second portion of the conductor are integrally formed with each other as one body.

* * * * *